(12) United States Patent
Liu et al.

(10) Patent No.: US 12,160,993 B2
(45) Date of Patent: Dec. 3, 2024

(54) MEMORY DEVICES INCLUDING DIFFERENT TIER PITCHES, AND RELATED ELECTRONIC SYSTEMS

(71) Applicant: Lodestar Licensing Group, LLC, Evanston, IL (US)

(72) Inventors: Yifen Liu, Meridian, ID (US); Tecla Ghilardi, Trescore Balneario (IT); George Matamis, Eagle, ID (US); Justin D. Shepherdson, Meridian, ID (US); Nancy M. Lomeli, Boise, ID (US); Chet E. Carter, Boise, ID (US); Erik R. Byers, Boise, ID (US)

(*) Notice: Subject to any disclaimer, the term of this patent is extended or adjusted under 35 U.S.C. 154(b) by 0 days.

(21) Appl. No.: 18/460,462

(22) Filed: Sep. 1, 2023

(65) Prior Publication Data

US 2023/0413563 A1    Dec. 21, 2023

Related U.S. Application Data

(63) Continuation of application No. 17/648,528, filed on Jan. 20, 2022, now Pat. No. 11,751,396, which is a
(Continued)

(51) Int. Cl.
*H10B 43/27* (2023.01)
*H01L 21/768* (2006.01)
(Continued)

(52) U.S. Cl.
CPC ....... *H10B 43/27* (2023.02); *H01L 21/76816* (2013.01); *H01L 21/76877* (2013.01);
(Continued)

(58) Field of Classification Search
None
See application file for complete search history.

(56) References Cited

U.S. PATENT DOCUMENTS 9,000,508 B2   4/2015   Lee et al.
9,397,107 B2   7/2016   Makala et al.
(Continued)

FOREIGN PATENT DOCUMENTS

KR   10-2020-0028490 A    3/2020
TW        201909388 A    3/2019
WO       2019/089152 A1   5/2019

OTHER PUBLICATIONS

International Search Report for Application No. PCT/US2021/033192, mailed Sep. 8, 2021, 4 pages.
(Continued)

*Primary Examiner* — Hsien Ming Lee
(74) *Attorney, Agent, or Firm* — TraskBritt

(57) ABSTRACT

A microelectronic device comprises a first set of tiers, each tier of the first set of tiers comprising alternating levels of a conductive material and an insulative material and having a first tier pitch, a second set of tiers adjacent to the first set of tiers, each tier of the second set of tiers comprising alternating levels of the conductive material and the insulative material and having a second tier pitch less than the first tier pitch, a third set of tiers adjacent to the second set of tiers, each tier of the third set of tiers comprising alternating levels of the conductive material and the insulative material and having a third tier pitch less than the second tier pitch, and a string of memory cells extending through the first set of tiers, the second set of tiers, and the third set of tiers. Related microelectronic devices, electronic systems, and methods are also described.

19 Claims, 8 Drawing Sheets

Related U.S. Application Data continuation of application No. 16/904,317, filed on Jun. 17, 2020, now Pat. No. 11,264,404.

(51) Int. Cl.
  *H01L 23/522* (2006.01)
  *H01L 23/528* (2006.01)
  *H01L 23/532* (2006.01)
  *H10B 41/27* (2023.01)
  *H10B 41/35* (2023.01)
  *H10B 43/35* (2023.01)

(52) U.S. Cl.
  CPC ...... *H01L 23/5226* (2013.01); *H01L 23/5283* (2013.01); *H01L 23/53257* (2013.01); *H01L 23/53271* (2013.01); *H10B 41/27* (2023.02); *H10B 41/35* (2023.02); *H10B 43/35* (2023.02)

(56) References Cited

U.S. PATENT DOCUMENTS

| | | | |
|---|---|---|---|
| 9,397,111 | B1 | 7/2016 | Chowdhury et al. |
| 9,806,090 | B2 | 10/2017 | Sharangpani et al. |
| 9,922,990 | B2 | 3/2018 | Song |
| 10,014,309 | B2 | 7/2018 | Dorhout et al. |
| 10,269,625 | B1 | 4/2019 | Matovu et al. |
| 10,446,578 | B1 | 10/2019 | Howder et al. |
| 10,497,715 | B2 | 12/2019 | Kim et al. |
| 2013/0161731 | A1 | 6/2013 | Bin et al. |
| 2013/0193395 | A1 | 8/2013 | Lee |
| 2013/0256775 | A1 | 10/2013 | Shim et al. |
| 2014/0362642 | A1 | 12/2014 | Dong et al. |
| 2015/0255468 | A1 | 9/2015 | Chen |
| 2016/0284723 | A1 | 9/2016 | Rabkin et al. |
| 2016/0293621 | A1 | 10/2016 | Huang et al. |
| 2017/0062454 | A1 | 3/2017 | Lu et al. |
| 2017/0186765 | A1 | 6/2017 | Koval et al. |
| 2019/0067246 | A1* | 2/2019 | Wu .............. H01L 21/76877 |
| 2020/0202962 | A1 | 6/2020 | Chen et al. |
| 2021/0125674 | A1 | 4/2021 | Chen et al. |
| 2021/0242235 | A1 | 8/2021 | Lee et al. |

OTHER PUBLICATIONS

Taiwanese First Office Action for Application No. 110119643, issued Jan. 22, 2022, 21 pages.

Written Opinion of the International Searching Authority for Application No. PCT/US2021/033192, mailed Sep. 8, 2021, 6 pages.

Taiwanese Search Report and Office Action from Taiwanese Application No. 111136088, dated Sep. 22, 2023, 6 pages.

* cited by examiner

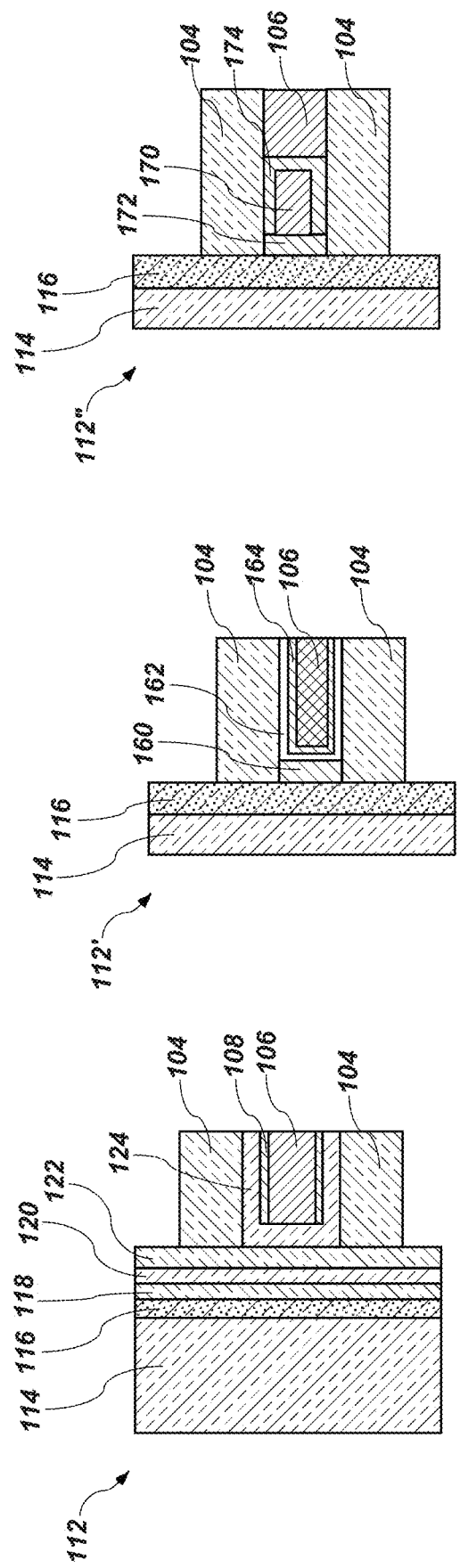

MEMORY DEVICES INCLUDING DIFFERENT TIER PITCHES, AND RELATED ELECTRONIC SYSTEMS

CROSS-REFERENCE TO RELATED APPLICATION

This application is a continuation of U.S. patent application Ser. No. 17/648,528, filed Jan. 20, 2022, now U.S. Pat. No. 11,751,396, issued on Sep. 5, 2023, which is a continuation of U.S. patent application Ser. No. 16/904,317, filed Jun. 17, 2020, now U.S. Pat. No. 11,264,404, issued Mar. 1, 2022, the disclosure of each of which is hereby incorporated herein in its entirety by this reference.

TECHNICAL FIELD

The disclosure, in various embodiments, relates generally to the field of microelectronic device design and fabrication. More specifically, the disclosure relates to microelectronic devices and apparatuses including tiers of alternating levels of insulative structures and conductive structures exhibiting a different tier pitch, and to related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. However, increasing the quantity of tiers of conductive structures can result in a larger height of the stack and relatively large aspect ratio in openings in which the vertical memory strings are formed. Due to the large aspect ratio and the height of the stack of tiers, dielectric materials and the conductive structures may collapse during one or more fabrication processes associated with forming the vertical memory strings.

BRIEF DESCRIPTION OF THE DRAWINGS

FIG. 1B through FIG. 1D are simplified cross-sectional views of a memory cell of a microelectronic device, in accordance with embodiments of the disclosure;

DETAILED DESCRIPTION

Figure 1A:
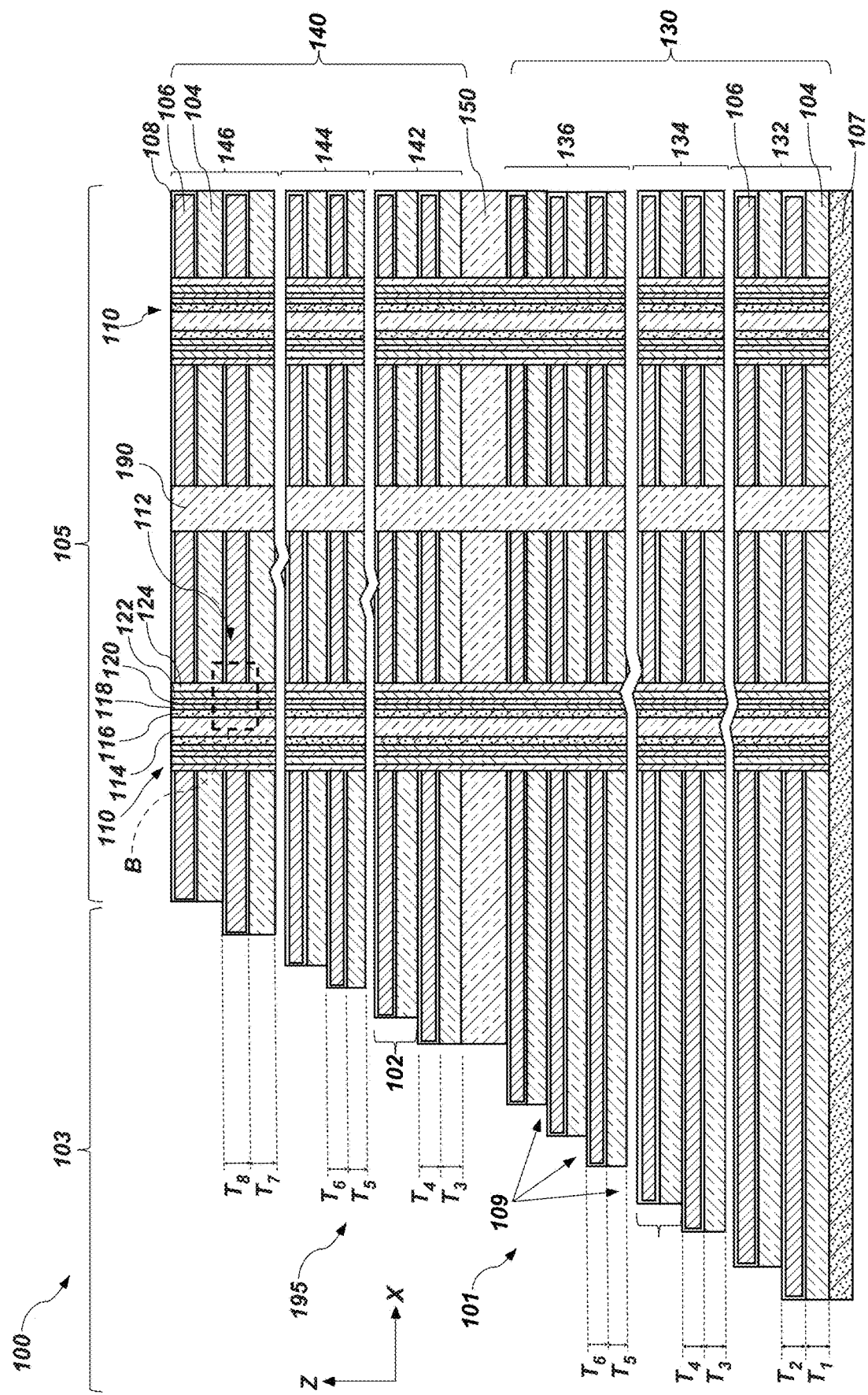
FIG. 1A is a simplified cross-sectional view of a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, or electronic system, or a complete microelectronic device, apparatus, or electronic system including a varying tier pitch. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "memory device" means and includes microelectronic devices exhibiting memory functionality, but not necessarily limited to memory functionality. Stated another way, and by way of example only, the term "memory device" means and includes not only conventional memory in the form of DRAM, NAND, etc., but also by way of example only, an application specific integrated circuit (ASIC) (e.g., a system on a chip (SoC)), a microelectronic device combining logic and memory, or a graphics processing unit (GPU) incorporating memory.

As used herein, the term "tier pitch" means and includes a distance between a feature of a tier and a similar, corresponding feature of an adjacent tier. The terms "tier pitch" and "tier thickness" may be used interchangeably herein.

According to embodiments described herein, a microelectronic device comprises a stack structure on or over a base structure such as a source structure. The stack structure may include vertically alternating insulative materials and conductive materials arranged in tiers. Each tier may individually include an insulative material vertically adjacent a conductive material. Different tiers of the stack structure may have a different thickness (e.g., in the vertical direction) depending on a depth of the respective tier from an upper surface of the microelectronic device (or, similarly, depending on a distance of the respective tier from the base structure). In some embodiments, the stack structure includes a first deck structure adjacent to (e.g., over) the base structure, an interdeck structure adjacent to (e.g., over) the first deck structure, and a second deck structure adjacent to (e.g., over) the interdeck structure. The first deck structure may include a first region of tiers adjacent to (e.g., over) the base structure, a second region of tiers adjacent to (e.g., over) the first region, and a third region of tiers adjacent to (e.g., over) the second region of tiers. A tier pitch of the tiers of the first region may be greater than the tier pitch of each of the tiers of the second region and the tiers of the third region. Accordingly, tiers of the first region may have a greater thickness than the tiers of each of the second region and the third region. In some such embodiments, at least the levels of the insulative materials of the first region may have a greater thickness than the levels of the insulative materials of each of the second region and the third region. In addition, a tier pitch of the tiers of the second region may be larger than the tier pitch of the tiers of the third region. In some such embodiments, at least the levels of the insulative materials of the second region may have a greater thickness than the thickness of the levels of the insulative materials of the third region.

In some embodiments, the second deck structure includes a fourth region of tiers adjacent to (e.g., over) the interdeck structure, a fifth region of tiers adjacent to (e.g., over) the fourth region of tiers, and a sixth region of tiers adjacent to (e.g., over) the fifth region of tiers. A tier pitch of the tiers of each of the fourth region, the fifth region, and the sixth region may be different. In some embodiments, the tier pitch of the fourth region may be greater than the tier pitch of the fifth region. The tier pitch of the sixth region may be greater than the tier pitch of the fourth region and the fifth region.

Strings of memory cells may extend through the stack structure, memory cells being located at intersections between the conductive materials and pillar structures (e.g., semiconductive pillars) vertically extending through the stack structure forming strings of memory cells. Dimensions of the memory cells may vary depending on the location of the memory cells within the string (e.g., whether the memory cells are located within the first region, the second region, the third region, the fourth region, the first region, or the sixth region). For example, the memory cells within the second region may be spaced farther from each other than the memory cells of the third region. In some embodiments, the first region may not include any triple level cells, while the second region, the third region, the fourth region, and the fifth region include triple level cells. Accordingly, in some embodiments, regions including a relatively greater tier pitch may not include triple level cells.

The greater thickness of the insulative materials of the first region and the second region may facilitate improved fabrication of the microelectronic device structure. For example, the greater tier pitch (and corresponding greater thickness of the insulative materials) of the first region and the second region relative to the tier pitch of the third region may facilitate performance of a so-called "replacement gate" process wherein sacrificial materials are removed from tiers and replaced with the conductive materials to form the tiers of the insulative materials and the conductive materials. After removal of the sacrificial materials, the insulative materials may exhibit a reduced tendency to collapse or topple, due to the increased thickness of the insulative materials (and the corresponding reduction in the aspect ratio thereof). In addition, the memory cells of the second region, which are spaced farther from adjacent memory cells than the memory cells of the third region, may exhibit improved operating properties. For example, the memory cells of the second region may exhibit an improved read window budget (RWB) and a more narrow threshold voltage distribution between levels of the memory cells due, at least in part, to the increased spacing of the memory cells of the second region. In addition, the memory cells of the fourth region may exhibit a similar improvement of the read window budget and narrower threshold voltage distribution compared to the memory cells of the fifth region.

FIG. 1A is a simplified cross-sectional view of a microelectronic device 100, in accordance with embodiments of the disclosure. The microelectronic device 100 may include a stack structure 101 including a vertically (e.g., in the Z-direction) alternative sequence of insulative materials 104 and conductive materials 106 arranged in tiers 102. Each of the tiers 102 may individually include a level of the insulative materials 104 directly vertically adjacent a level of the conductive materials 106. The insulative materials 104 of the stack structure 101 may also be referred to herein as "insulative structures" and the conductive materials 106 of the stack structure 101 may also be referred to herein as "conductive structures."

The levels of the insulative materials 104 may be formed of and include, for example, at least one dielectric material, such as one or more of an oxide material (e.g., silicon dioxide ($SiO_2$)), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), and aluminum oxide ($Al_2O_3$). In some embodiments, the insulative materials 104 are formed of and include silicon dioxide.

The levels of the conductive materials 106 may each comprise, for example, access lines, which may be referred to as word lines. The levels of the conductive materials 106 may be formed of and include, for example, at least one electrically conductive material, such as, for example, tungsten, titanium, nickel, cobalt, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive materials 106 comprise tungsten. In other embodiments, the conductive materials 106 comprise polysilicon.

As shown in FIG. 1A, optionally, a conductive liner material 108 may be located around the conductive materials 106, such as between the conductive materials 106 and the insulative materials 104. The conductive liner material 108 may comprise, for example, a seed material from which the conductive material 106 may be formed. The conductive liner material 108 may be formed of and include, for example, a metal (e.g., titanium, tantalum), a metal nitride (e.g., tungsten nitride, titanium nitride, tantalum nitride), or another material. In some embodiments, the conductive liner material 108 comprises titanium nitride. However, in some embodiments, the microelectronic device 100 does not include the conductive liner material 108 and the conductive materials 106 are directly adjacent to and physically contact the insulative materials 104. By way of non-limiting example, in some embodiments, the conductive material 106 comprises polysilicon and the microelectronic device 100 does not include the conductive liner material 108.

The stack structure 101 may be formed over a source material 107. The source material 107 may be formed of and include, for example, a semiconductor material doped with one of P-type conductivity materials (e.g., polysilicon doped with at least one P-type dopant (e.g., boron ions)) or N-type conductivity materials (e.g., polysilicon doped with at least one N-type dopant (e.g., arsenic ions, phosphorous ions, antimony ions)).

The stack structure may include a stair step region 103 and a memory cell region 105. The stair step region 103 may include at least one staircase structure 195 including steps 109 defined by horizontal ends of at least some of the tiers 102 of the stack structure 101. In some embodiments, each step 109 of the staircase structure 195 may be defined by horizontal ends of one insulative material 104 and one conductive material 106. However, the disclosure is not so limited and the steps 109 may be defined be more than one of the insulative materials 104 and one of the conductive materials 106.

Strings 110 of memory cells 112 may vertically extend (e.g., in the Z-direction) through the stack structure 101. The strings 110 of memory cells 112 may each individually comprise multiple memory cells 112 substantially horizontally aligned with one another within the stack structure 101. Box B illustrates a memory cell 112, in accordance with some embodiments of the disclosure. Adjacent strings 110 of memory cells 112 may be separated from each other by, for example, pillars of an insulative material 190.

FIG. 1B is a simplified blown up view of box B of FIG. 1A illustrating a memory cell 112, in accordance with embodiments of the disclosure. With reference to FIG. 1A and FIG. 1B, each memory cell 112 may include an insulative material 114, a channel material 116 horizontally adjacent to the insulative material 114, a tunnel dielectric material (also referred to as a "tunneling dielectric material") 118 horizontally adjacent to the channel material 116, a memory material 120 horizontally adjacent to the tunnel dielectric material 118, a dielectric blocking material (also referred to as a "charge blocking material") 122 horizontally adjacent to the memory material 120, and a dielectric barrier material 124 horizontally adjacent to the dielectric blocking material 122. The dielectric barrier material 124 may be horizontally adjacent to one of the levels of conductive materials 106 of one of the tiers 102 of the stack structure 101. In some embodiments, and with reference to FIG. 1B, the dielectric barrier material 124 may be disposed around the conductive material 106. In other embodiments, and with reference to FIG. 1A, the dielectric barrier material 124 may extend vertically through the string 110. The channel material 116 may be horizontally interposed between the insulative material 114 and the tunnel dielectric material 118; the tunnel dielectric material 118 may be horizontally interposed between the channel material 116 and the memory material 120; the memory material 120 may be horizontally interposed between the tunnel dielectric material 118 and the dielectric blocking material 122; the dielectric blocking material 122 may be horizontally interposed between the memory material 120 and the dielectric barrier material 124; and the dielectric barrier material 124 may be horizontally interposed between the dielectric blocking material 122 and the level of conductive material 106.

Each of the memory cells 112 may be located at an intersection of a conductive material 106 of one of the tiers 102 of the stack structure 101 and a pillar structure vertically extending through the stack structure 101 and including the insulative material 114, the channel material 116, the tunnel dielectric material 118, the memory material 120, the dielectric blocking material 122, and the dielectric barrier material 124.

The insulative material 114 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 114 comprises silicon dioxide.

The channel material 116 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 116 includes amorphous silicon or polysilicon. In some embodiments, the channel material 116 comprises a doped semiconductor material.

The tunnel dielectric material 118 may be formed of and include a dielectric material through which charge tunneling can be performed under suitable electrical bias conditions, such as through hot-carrier injection or by Fowler-Nordheim tunneling induced charge transfer. The tunnel dielectric material 118 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 118 comprises silicon dioxide or silicon oxynitride.

The memory material 120 may comprise a charge trapping material or a conductive material. The memory material 120 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 120 comprises silicon nitride.

The dielectric blocking material 122 may be formed of and include a dielectric material such as, for example, one or more of an oxide (e.g., silicon dioxide), a nitride (silicon nitride), and an oxynitride (silicon oxynitride), or another material. In some embodiments, the dielectric blocking material 122 comprises silicon oxynitride.

In some embodiments the tunnel dielectric material 118, the memory material 120, and the dielectric blocking material 122 together may form comprise a structure configured to trap a charge, such as, for example, an oxide-nitride-oxide (ONO) structure. In some such embodiments, the tunnel dielectric material 118 comprises silicon dioxide, the memory material 120 comprises silicon nitride, and the dielectric blocking material 122 comprises silicon dioxide.

The dielectric barrier material 124 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the dielectric barrier material 124 comprises aluminum oxide.

Although the memory cells 112 of FIG. 1A and FIG. 1B have been described and illustrated as having a particular structure and composition, the disclosure is not so limited. FIG. 1C is a simplified cross-sectional view of a memory cell 112', in accordance with embodiments of the disclosure. One or more of (e.g., all of) the memory cells 112 of FIG. 1A may be replaced with the memory cell 112'. With reference to FIG. 1C, the memory cell 112' may include the insulative material 114 and the channel material 116 as described above with reference to the memory cells 112. The memory cell 112' may further include a first dielectric material (e.g., a tunnel dielectric material) 160 horizontally adjacent to the channel material 116, a second dielectric material (e.g., a charge trapping material) 162 horizontally adjacent to the first dielectric material 160, and a third dielectric material (e.g., a charge blocking material) 164 horizontally adjacent to the second dielectric material 162 and the conductive material 106. In some embodiments, the first dielectric material comprises an oxide material (e.g., silicon dioxide), the second dielectric material comprises a nitride material (e.g., silicon nitride), and the third dielectric material 164 comprises an oxide material (e.g., silicon dioxide). For clarity, in FIG. 1C, the conductive liner material 108 (FIG. 1A, FIG. 1B) is not illustrated around the conductive material 106. However, it will be understood that in some embodiments, the memory cell 112' may include the conductive liner material 108.

FIG. 1D is a simplified cross-sectional view of a memory cell 112", in accordance with additional embodiments of the disclosure. The memory cell 112" may include the insulative material 114 and the channel material 116. In some embodiments, the memory cell 112" may comprise a so-called "floating gate" memory cell. The memory cell 112" may include an electrode structure 170, which may be referred to as a "floating gate." The electrode structure 170 may comprise an electrically conductive material, such as, for example, one or more of the materials described above with reference to the conductive materials 106. In some embodiments, the electrode structure 170 comprises polysilicon. In other embodiments, the electrode structure 170 comprises tungsten.

With continued reference to FIG. 1D, the memory cell 112" may further include a dielectric material 172, which may be referred to as a "gate dielectric" material. The dielectric material 172 may comprise, for example, one or more of the materials described above with reference to the tunnel dielectric material 118. In some embodiments, the dielectric material 172 comprises silicon dioxide. An other dielectric material 174 may be located around portions of the electrode structure 170. The other dielectric material 174 may comprise one or more of the materials described above with reference to the tunnel dielectric material 118. In some embodiments, the other dielectric material 174 has the same material composition as the dielectric material 172. The other dielectric material 174 may be located between the electrode structure 170 and the conductive material 106. For clarity, in FIG. 1D, the conductive liner material 108 (FIG. 1A, FIG. 1B) is not illustrated around the conductive material 106. However, it will be understood that in some embodiments, the memory cell 112" may include the conductive liner material 108.

Referring back to FIG. 1A, the stack structure 101 may include a first deck structure 130 vertically overlying the source material 107, an interdeck structure 150 vertically overlying the first deck structure 130, and a second deck structure 140 vertically overlying the interdeck structure 150.

The first deck structure 130 may include a first region 132 of tiers 102 vertically overlying the source material 107, a second region 134 of tiers 102 vertically overlying the first region 132, and a third region 136 of tiers 102 vertically overlying the second region 134. A tier pitch of the tiers 102 in the first region 132 may be different than a tier pitch of the tiers 102 of each of the second region 134 and the third region 136. In addition, the tier pitch of the second region 134 may be different than the tier pitch of the third region 136. In some embodiments, the tier pitch of the first region 132 is larger than the tier pitch of each of the second region 134 and the third region 136 and the tier pitch of the second region is larger than the tier pitch of the third region 136.

In some embodiments, a number (e.g., quantity) of tiers 102 of the first deck structure 130 may be within a range from about 64 of the tiers 102 to about 256 of the tiers 102. In some embodiments, the first deck structure 130 includes 128 tiers 102. However, the disclosure is not so limited, and the first deck structure 130 may include a different number of the tiers 102.

A number of tiers 102 of the first region 132 may be from about 1 of the tiers 102 to about 20 of the tiers 102, such as from 1 of the tiers 102 to 4 of the tiers 102, from 4 of the tiers 102 to 8 of the tiers 102, from 8 of the tiers 102 to 12 of the tiers 102, or from 12 of the tiers 102 to 20 of the tiers 102. In some embodiments, the first region 132 includes 8 of the tiers 102.

For each tier 102 within the first region 132 of the first deck structure 130, the insulative material 104 may have a thickness (in the z-direction) $T_1$, and the conductive material 106 and conductive liner material 108 may have a combined thickness (in the z-direction) $T_2$. As used herein, the thickness $T_2$ of the conductive material 106 means and includes the combined thickness of the conductive material 106 and the conductive liner material 108, if present. Stated another way, the thickness $T_2$ defines a distance or spacing between adjacent insulative materials 104 in the first region 132. In some embodiments, the thickness $T_1$ of the insulative material 104 and the thickness $T_2$ comprise a total thickness of each tier 102. In some embodiments, the thickness $T_1$ of the insulative material 104 and the thickness $T_2$ comprise a total thickness of each tier 102 within the first region 132. Accordingly, the tier pitch of the tiers 102 of the first region 132 comprises the sum of the thicknesses $T_1$, $T_2$.

The thickness $T_1$ of the insulative material 104 of each of the tiers 102 within the first region 132 may be within a range from about 20 nanometers (nm) to about 30 nm, such as from about 20 nm to about 22 nm, from about 22 nm to about 24 nm, from about 24 nm to about 26 nm, from about 26 nm to about 28 nm, or from about 28 nm to about 30 nm. In some embodiments, the thickness $T_1$ is from about 21 nm to about 25 nm. In some embodiments, the thickness $T_1$ is about 23 nm.

The thickness $T_2$ of the conductive materials 106 of each of the tiers 102 within the first region 132 may be within a range from about 25 nm to about 35 nm, such as from about 25 nm to about 27 nm, from about 27 nm to about 29, from about 29 nm to about 31 nm, from about 31 nm to about 33 nm, or from about 33 nm to about 35 nm. In some embodiments, the thickness $T_2$ is from about 28 nm to about 32 nm. In some embodiments, the thickness $T_2$ is about 30 nm. In some embodiments, the thickness $T_2$ may be greater than the thickness $T_1$.

In some embodiments, a thickness of the tiers 102 within the first region 132 is substantially uniform. In other words, a thickness between one tier 102 of the first region 132 may not substantially vary from a thickness of other tiers 102 of the first region 132. Stated another way, the tier pitch within the first region 132 may not substantially vary between the tiers 102 of the first region 132.

The tiers 102 of the first region 132 may include conductive materials 106 that comprise one or more of select gate structures (e.g., select gate source (SGS) structures), dummy word lines, and word lines for memory cells 112 comprising single level cells (SLCs). In some embodiments, at least some of the conductive materials 106 comprise dummy word lines and are not associated with a memory cell 112 storing data.

In some embodiments, about one half of the tiers 102 of the first region 132 include conductive materials 106 comprising select gate structures, the remaining tiers 102 including conductive materials 106 that comprise word lines of dummy tiers 102 or word lines of a single level cell. In some embodiments, the first region 132 includes 4 tiers 102 comprising select gate structures, 3 dummy tiers 102, and one tier 102 including a single level cell.

The second region 134 of the first deck structure 130 may include memory cells 112 that comprise multi-level cells (MLCs), such as, for example, triple level cells (TLCs). In some embodiments, the memory cells 112 associated with the second region 134 may include triple level memory cells. In some embodiments, substantially all of the memory cells 112 within the second region 134 comprise triple level cells. In some such embodiments, the conductive materials 106 of the second region 134 may each form a part of (e.g., a word line of) a memory cell 112 comprising a triple level cell.

The second region 134 may include from 10 of the tiers 102 to 30 of the tiers 102, such as from 10 of the tiers 102 to 15 of the tiers 102, from 15 of the tiers 102 to 20 of the tiers 102, from 20 of the tiers 102 to 25 of the tiers 102, or from 25 of the tiers 102 to 30 of the tiers 102. In some embodiments, the second region 134 includes from 10 of the tiers 102 to 14 of the tiers 102. In some embodiments, the second region 134 includes 12 of the tiers 102.

For each tier 102 within the second region 134 of the first deck structure 130, the insulative material 104 may have a thickness (in the z-direction) $T_3$, and the conductive material 106 and conductive liner material 108 may have a thickness (in the z-direction) $T_4$. As used herein, the thickness $T_4$ of the conductive material 106 means and includes the combined thickness of the conductive material 106 and the conductive liner material 108, if present. In other words, the thickness $T_4$ corresponds to the spacing between insulative materials 104 of the second region 134. In some embodiments, the thickness $T_3$ of the insulative material 104 and the thickness $T_4$ comprise a total thickness of each tier 102 within the second region 134. Accordingly, the tier pitch of the second region 134 may correspond to the sum of the thicknesses $T_3$, $T_4$. In some embodiments, the tier pitch of the second region 134 is less than the tier pitch of the first region 132.

The thickness $T_3$ of the insulative material 104 of each of the tiers 102 within the second region 134 may be within a range from about 18 nm to about 28 nm, such as from about 18 nm to about 20 nm, from about 20 nm to about 22 nm, from about 22 nm to about 24 nm, from about 24 nm to about 26 nm, or from about 26 nm to about 28 nm. In some embodiments, the thickness $T_3$ is from about 20 nm to about 24 nm. In some embodiments, the thickness $T_3$ is about 22 nm. In some embodiments, the thickness $T_3$ of the insulative materials 104 within the second region 134 is less than the thickness $T_1$ of the insulative materials 104 within the first region 132.

The thickness $T_1$ of the insulative material 104 of each of the tiers 102 of the first region 132 may be within a range of from about one percent to about ten percent greater than the thickness $T_3$ of the insulative material 104 of each of the tiers 102 of the second region 134, such as from about one percent to about two percent, from about two percent to about five percent, or from about five percent to about ten percent greater than the thickness $T_3$.

The thickness $T_4$ of the conductive material 106 of each of the tiers 102 within the second region 134 may be within a range from about 24 nm to about 34 nm, such as from about 24 nm to about 26 nm, from about 26 nm to about 28, from about 28 nm to about 30 nm, from about 30 nm to about 32 nm, or from about 32 nm to about 34 nm. In some embodiments, the thickness $T_4$ is from about 27 nm to about 31 nm. In some embodiments, the thickness $T_4$ is about 29 nm. The thickness $T_4$ may be greater than the thickness $T_3$. In some embodiments, the thickness $T_4$ of the conductive material 106 of each of the tiers 102 within the second region 134 is less than the thickness $T_2$ of the conductive material 106 of each of the tiers 102 within the first region 132. The thickness $T_2$ of the conductive materials 106 of the first region 132 may be within a range of from about one percent to about ten percent greater than the thickness $T_4$ of the conductive materials 106 of the second region 134, such as from about one percent to about two percent, from about two percent to about five percent, or from about five percent to about ten percent greater than the thickness $T_4$.

In some embodiments, a thickness of the tiers 102 within the second region 134 is substantially uniform. In other words, a thickness between one tier 102 of the second region 134 may not substantially vary from a thickness of other tiers 102 of the second region 134. Stated another way, the tier pitch of the tiers 102 of the second region 134 may be substantially uniform.

With continued reference to FIG. 1A, the third region 136 may include 32 of the tiers 102 to 120 of the tiers 102, such as from 32 of the tiers 102 to 64 of the tiers 102, from 64 of the tiers 102 to 80 of the tiers 102, from 80 of the tiers 102 to 96 of the tiers 102, or from 96 of the tiers 102 to 120 of the tiers 102. In some embodiments, the third region 136 includes from 100 of the tiers 102 to 110 of the tiers 102. In some embodiments, the third region 136 includes 105 of the tiers 102.

In some embodiments, a majority (e.g., all, substantially all, all but one, all but two) of the conductive materials 106 of the third region 136 may be associated with memory cells 112 comprising triple level cells. In some embodiments, some of the conductive materials 106 of the third region 136 may comprise a portion of (e.g., a word line of) a memory cell 112 comprising a multilevel cell and one of the conductive materials 106 of the third region 136 may comprise a portion of (e.g., a word line of) a dummy region. By way of non-limiting example, an uppermost tier 102 of the third region 136 may include a conductive material 106 comprising a dummy word line, a tier 102 adjacent to the uppermost tier 102 may comprise a conductive material 106 comprising a word line of a multilevel cell, and the other conductive materials 106 of the third region 136 may comprise word lines of triple level cells.

For each tier 102 within the third region 136 of the first deck structure 130, the insulative material 104 may have a thickness (in the z-direction) $T_5$ and the conductive material 106 and conductive liner material 108 may have a thickness (in the z-direction) $T_6$. As used herein, the thickness $T_6$ of the conductive material 106 means and includes the combined thickness of the conductive material 106 and the conductive liner material 108, if present. In other words, the thickness $T_6$ corresponds to the spacing between insulative materials 104 of the third region 136. In some embodiments, the thickness $T_5$ of the insulative material 104 and the thickness $T_6$ comprise a total thickness of each tier 102 within the third region 136 and the sum of the thicknesses $T_5$, $T_6$ corresponds to the tier pitch of the third region 136. In some embodiments, the tier pitch of the third region 136 is less than the tier pitch of the first region 132 and the tier pitch of the second region 134.

The thickness $T_5$ of the insulative material 104 of each of the tiers 102 within the third region 136 may be within a range from about 16 nm to about 24 nm, such as from about 16 nm to about 18 nm, from about 18 nm to about 20 nm, from about 20 nm to about 22 nm, or from about 22 nm to about 24 nm. In some embodiments, the thickness $T_5$ is from about 18 nm to about 22 nm. In some embodiments, the thickness $T_5$ is about 20 nm. In some embodiments, the thickness $T_5$ of the insulative materials 104 within the third region 136 is less than the thickness $T_3$ of the insulative materials 104 within the second region 134 or the thickness $T_1$ of the insulative materials 104 within the first region 132.

The thickness $T_1$ of the insulative materials 104 of each of the tiers 102 of the first region 132 may be within a range of from about one percent to about twenty percent greater than the thickness $T_5$ of each of the tiers 102 of the insulative materials 104 of the third region 136, such as from about one percent to about two percent, from about two percent to about five percent, from about five percent to about ten percent, or from about ten percent to about twenty percent greater than the thickness $T_5$.

The thickness $T_6$ of the conductive material 106 of each of the tiers 102 within the third region 136 may be within a range from about 24 nm to about 34 nm, such as from about 24 nm to about 26 nm, from about 26 nm to about 28 nm, from about 28 nm to about 30 nm, from about 30 nm to about 32 nm, or from about 32 nm to about 34 nm. In some embodiments, the thickness $T_6$ is from about 27 nm to about 31 nm. In some embodiments, the thickness $T_6$ is about 29 nm. In some embodiments, the thickness $T_6$ is the same as the thickness $T_4$. In some embodiments, the thickness $T_6$ of the conductive materials 106 within the third region 136 is less than the thickness $T_2$ of the conductive materials 106 within the first region 132. The thickness $T_2$ of the conductive materials 106 of the first region 132 may be within a range of from about one percent to about twenty percent greater than the thickness $T_6$ of the conductive materials 106 of the third region 136, such as from about one percent to about two percent, from about two percent to about five percent, from about five percent to about ten percent greater, or from about ten percent to about twenty percent greater than the thickness $T_4$.

In some embodiments, a thickness of the tiers 102 within the third region 136 is substantially uniform. In other words, a thickness between one tier 102 of the third region 136 may not substantially vary from a thickness of other tiers 102 of the third region 136. Stated another way, in some embodiments, the tier pitch of the tiers 102 of the third region 136 may be substantially uniform.

In some embodiments, the tier pitch of the second region 134 is about 2 nm less than the tier pitch of the first region 132 and about 2 nm greater than tier pitch of the third region 136. In some embodiments, the tier pitch of the first region 132 is about 53 nm, the tier pitch of the second region 134 is about 51 nm, and the tier pitch of the third region 136 is about 49 nm.

The interdeck structure 150 may be between the first deck structure 130 and the second deck structure 140. The interdeck structure 150 may comprise, for example, a first oxide material (e.g., silicon dioxide) adjacent to (e.g., over) the first deck structure 130, a nitride material (e.g., silicon nitride) adjacent to (e.g., over) the first oxide material, and a second oxide material (e.g., silicon dioxide) adjacent to (e.g., over) the nitride material. In some embodiments, the interdeck structure 150 comprises one or more etch stop materials, such as, for example, one or more of aluminum oxide or cerium oxide. However, the disclosure is not so limited and the interdeck structure 150 may include other materials or structures.

The second deck structure 140 may include a fourth region 142 of tiers 102 vertically overlying the interdeck structure 150, a fifth region 144 of tiers 102 vertically overlying the fourth region 142, and a sixth region 146 of tiers 102 vertically overlying the fifth region 144. In some embodiments, the tier pitch of the fourth region 142 is greater than the tier pitch of the fifth region 144 and less than the tier pitch of the sixth region 146. The tier pitch of the sixth region 146 may be larger than the tier pitch of the fifth region 144.

In some embodiments, a number of the tiers 102 of the second deck structure 140 may be within a range from 64 of the tiers to 256 of the tiers 102. In some embodiments, the second deck structure 140 includes 128 of the tier 102. However, the disclosure is not so limited, and the second deck structure 140 may include a different number of the tiers 102.

The fourth region 142 may include from 8 of the tiers 102 to 30 of the tiers 102, such as from 8 tiers of the 102 to 12 of the tiers 102, from 12 of the tiers 102 to 20 of the tiers 102, or from 20 of the tiers 102 to 30 of the tiers 102. In some embodiments, the fourth region 142 comprises 20 of the tiers.

The levels of the insulative material 104 and the conductive material 106 of the fourth region 142 may have the same thickness $T_3$, $T_4$, respectively as the respective levels of the insulative material 104 and conductive material 106 of the second region 134 of the first deck structure 130.

The conductive materials 106 of the tiers 102 of the fourth region 142 may be associated with one or more of memory cells 112 that are triple level cells, multilevel cells, or dummy cells. In some embodiments, a majority of the conductive materials 106 of the fourth region 142 are associated with memory cells 112 comprising triple level cells. In some embodiments, the fourth region 142 includes 20 of the tiers 102; 3 of the tiers comprising dummy memory cells, 1 of the tiers comprising a multilevel cell, and about 16 of the tiers including triple level cells.

The fifth region 144 may include from 32 of the tiers 102 to 120 of the tiers 102, such as from 32 of the tiers 102 to 64 of the tiers 102, from 64 of the tiers 102 to 80 of the tiers 102, from 80 of the tiers 102 to 96 of the tiers 102, or from 96 of the tiers 102 to 120 of the tiers 102. In some embodiments, the fifth region 144 includes from 95 of the tiers 102 to 105 of the tiers 102. In some embodiments, the fifth region 144 includes 100 of the tiers 102.

The tiers 102 of the fifth region 144 may include memory cells 112 comprising triple level cells, single level cells, or both. In other words, some of the tiers 102 of the fifth region 144 may include triple level cells and others of the tiers 102 of the fifth region 144 may include single level cells. In some embodiments, a majority (e.g., substantially all, all but one) of the tiers 102 of the fifth region 144 include triple level cells and the other of the tiers 102 (e.g., one of the tiers 102) of the fifth region 144 may include single level cells. In some embodiments, an uppermost conductive material 106 of the fifth region 144 comprises a word line of a single level cell while the other conductive materials 106 comprise word lines of triple level cells.

The levels of the insulative material 104 and the conductive material 106 of the fifth region 144 of the second deck structure 140 may have the same thickness $T_5$, $T_6$, respectively as the respective levels of the insulative material 104 and conductive material 106 of the third region 136.

With continued reference to FIG. 1A, the sixth region 146 may include from 1 of the tiers 102 to 20 of the tiers 102, such as from 1 of the tiers 102 to 4 of the tiers 102, from 4 of the tiers 102 to 8 of the tiers 102, from 8 of the tiers 102 to 12 of the tiers 102, or from 12 of the tiers 102 to 20 of the tiers 102. In some embodiments, the sixth region 146 includes 8 of the 102. In some embodiments, the sixth region 146 includes a same number of the tiers 102 as the first region 132.

The tiers 102 of the sixth region 146 may include conductive materials 106 that comprise one or more of select gate structures, such as select gate drain (SGD) structures or word lines of dummy memory cells. In some embodiments, at least some of the conductive materials 106 comprise dummy word lines and are not associated with a memory cell 112 storing data.

In some embodiments, about one half of the tiers 102 of the sixth region 146 include conductive materials 106 comprising select gate structures. In some such embodiments, the remaining tiers 102 comprise conductive materials 106 that form a portion of dummy tiers 102. In some embodiments, the sixth region 146 includes 4 tiers 102 comprising select gate structures and 4 dummy tiers 102.

A thickness $T_7$ of the insulative material 104 of each of the tiers 102 of the sixth region 146 may be within a range from about 24 nm to about 32 nm, such as from about 24 nm to about 26 nm, from about 26 nm to about 28 nm, from about 28 nm to about 30 nm, from about 30 nm to about 32 nm, or from about 32 nm to about 34 nm. In some embodiments, the thickness $T_7$ is within a range from about 26 nm to about 30 nm. In some embodiments, the thickness $T_7$ is about 28 nm. In some embodiments, the thickness $T_7$ is greater than each of the thickness $T_1$, the thickness $T_3$, and the thickness $T_5$.

A thickness $T_8$ of the each of the conductive material 106 of each of the tiers 102 of the sixth region 146 may be within a range from about 22 nm to about 32 nm, such as from about 22 nm to about 24 nm, from about 24 nm to about 26 nm, from about 26 nm to about 28 nm, from about 28 nm to about 30 nm, or from about 30 nm to about 32. In some embodiments, the thickness $T_8$ is within a range from about 26 nm to about 28 nm. In some embodiments, the thickness $T_8$ is about 27 nm.

Since the tiers 102 of each of the first region 132, the second region 134, the third region 136, the fourth region 142, and the fifth region 144 have different tier pitches, and since the insulative materials 104 and conductive materials 106 of the tiers 102 have different thicknesses $T_1$, $T_2$, $T_3$, $T_4$, $T_5$, $T_6$, the memory cells 112 of such regions may have different dimensions (e.g., corresponding to the thicknesses of the conductive materials 106 of such regions) and may be spaced from each other by different distances (e.g., corresponding to the thicknesses of the insulative materials 104 of such regions). Accordingly, the first deck structure 130 may include memory cells 112 within the first region 132 spaced from each other by a distance that is greater than a distance by which the memory cells 112 of the second region 134 or the memory cells 112 of the third region 136 are spaced from each other. In addition, the memory cells 112 of the first region 132 may have a greater dimension (e.g., thickness) than the memory cells 112 of the second region 134 or the third region 136. The memory cells 112 of the second region 134 may be spaced from each other by a distance that is greater than a distance by which the memory cells 112 of the third region 136 are spaced from each other and may have a greater dimension (e.g., thickness) than the memory cells 112 of the third region 136. In addition, the second deck structure 140 may include memory cells 112 within the fourth region 142 with different dimensions (e.g., corresponding to the thickness of the conductive materials 106 of the fourth region 142) and that are spaced apart from each other a greater distance (e.g., corresponding to the thickness of the insulative materials 104 of the fourth region 142) than the memory cells 112 within the fifth region 144.

In some embodiments, the increased tier pitch (and associated increased thickness $T_3$ of the insulative materials 104) of the second region 134 relative to the tier pitch of other regions (e.g., the third region 136) may facilitate improved performance of the memory cells 112 of the second region 134 relative to the memory cells 112 of the other regions not exhibiting the increased tier pitch or associated increased thickness of the insulative materials 104 thereof. The memory cells 112 of the second region 134 may exhibit a larger read write budget (RWB) compared to memory cells 112 that are located in tiers with a smaller pitch (e.g., the memory cells 112 of the third region 136). For example, the voltage range of the different levels of the triple level cells may be narrower for the memory cells 112 of the second region 134 compared to the memory cells 112 of the third region 136. Since the voltage range of the different levels of the memory cells 112 of the second region 134 is narrower, the operating voltage of such memory cells may fit within a narrower operating voltage window and the memory cells may exhibit an increased margin between individual read voltages and program verify voltages of each level of the triple level cells.

In addition, in some embodiments, the strings 110 may exhibit a taper such that portions of the strings 110 located in an upper portion of the stack structure 101 (e.g., in the fifth region 144, the sixth region 146) exhibit a larger dimension (e.g., diameter) than portions of the string 110 in lower portions of the stack structure 101 (e.g., portions of the string 110 in the first region 132 or the second region 134). The smaller dimension at the lower portions (e.g., the first region 132, the second region 134) may result in a stronger electric field and a larger read disturb of the memory cells 112 at the lower portion (e.g., the memory cells 112 of the second region 134) compared to memory cells of the third region 136. Forming the memory cells 112 of the second region 134 to have a larger vertical dimensions (e.g., compared to memory cells 112 of the third region 136) may improve the device performance of such memory cells 112.

Further, as will be described herein, in embodiments in which the microelectronic device 100 is formed by a so-called "replacement gate" process, the microelectronic device 100 may be formed by forming a stack structure comprising tiers of the insulative materials 104 and sacrificial materials, followed by subsequent removal (e.g., exhuming, replacing) of the sacrificial materials from the stack and forming the conductive materials 106 in a volume remaining between the levels of the insulative materials 104 after removal of the sacrificial materials. In some such embodiments, formation of the insulative materials 104 having the larger thickness $T_1$ in the first region 132 and the larger thickness $T_2$ in the second region 134 relative to the third region 136 may reduce a likelihood of such insulative materials 104 collapsing during the replacement gate process. For example, after removal of the sacrificial materials, and due to the aspect ratio of the openings remaining between the insulative materials 104 after removal of the sacrificial materials, the insulative materials 104 may exhibit stresses, leading to bending and collapse of at least some of the remaining insulative materials 104. Forming the insulative materials 104 of the different regions 132, 134, 136, 142, 144, 146 to have different thicknesses $T_1$, $T_3$, $T_5$, $T_7$ may facilitate forming the microelectronic device 100 with a reduced risk of collapse of the insulative materials 104. For example, forming the insulative materials 104 of the first region 132 and the second region 134 (e.g., the regions located more proximate the source material 107 and having a larger dimension (e.g., diameter)) to have larger thicknesses $T_1$, $T_3$ may facilitate forming the microelectronic device 100 with a reduce risk of collapse of such insulative materials 104.

Although FIG. 1A has been described and illustrated as comprising different regions of tiers 102 each region including tiers 102 having a different tier pitch, the disclosure is not so limited. In other embodiments, the first deck structure 130 may include tiers 102 exhibiting a gradient in tier pitch. For example, lowermost tiers 102 may exhibit a greater tier pitch, with the tier pitch (e.g., thickness) of the tiers 102 decreasing with each tier 102 and with a distance from the source material 107. In other words, the tiers 102 may exhibit a gradient tier pitch, with the tier pitch increasing with a depth of the tier 102. Similarly, the second deck structure 140 may include a gradient tier pitch. For example, lowermost tiers 102 of the second deck structure 140 may exhibit a greater tier pitch, with the tier pitch (e.g., thickness) of the tiers 102 decreasing with each tier 102 and with a distance from the interdeck structure 150. In other words, the tiers 102 may exhibit a gradient tier pitch, with the tier pitch increasing with a depth of the tier 102.

Accordingly, in some embodiments, a microelectronic device comprises a first set of tiers, each tier of the first set of tiers comprising alternating levels of a conductive material and an insulative material and having a first tier pitch, a second set of tiers adjacent to the first set of tiers, each tier of the second set of tiers comprising alternating levels of the conductive material and the insulative material and having a second tier pitch less than the first tier pitch, a third set of tiers adjacent to the second set of tiers, each tier of the third set of tiers comprising alternating levels of the conductive material and the insulative material and having a third tier pitch less than the second tier pitch, and a string of memory cells extending through the first set of tiers, the second set of tiers, and the third set of tiers.

Accordingly, in some embodiments, a microelectronic device comprises a stack structure comprising vertically alternating conductive structures and insulative structures arranged in tiers, each of the tiers individually comprising one of the conductive structures and one of the insulative structures. The stack structure comprises a first region comprising a first number of the tiers, each tier of the first region spaced from an adjacent tier a first distance, a second region comprising a second number of the tiers adjacent to the first region, each tier of the second region spaced from an adjacent tier a second distance less than the first distance, and a third region comprising a third number of the tiers adjacent to the second region, each tier of the third region spaced from an adjacent tier a third distance less than the second distance. The microelectronic device further comprises strings of memory cells vertically extending through the each of the first region, the second region, and the third region.

Figure 2A:
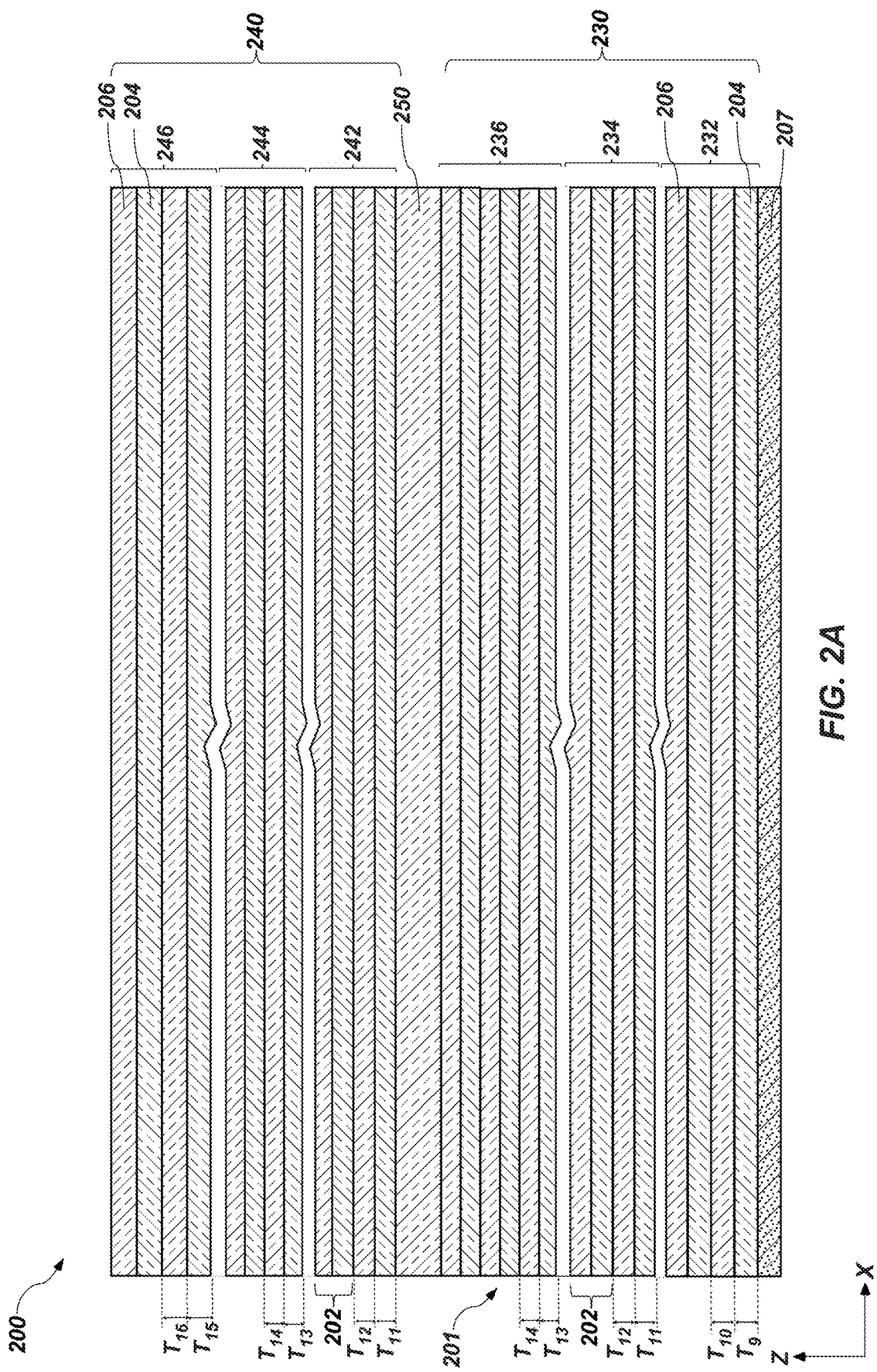
FIG. 2A through FIG. 2C are simplified cross-sectional views illustrating a method of forming a microelectronic device structure, in accordance with embodiments of the disclosure.
Figure 2B:
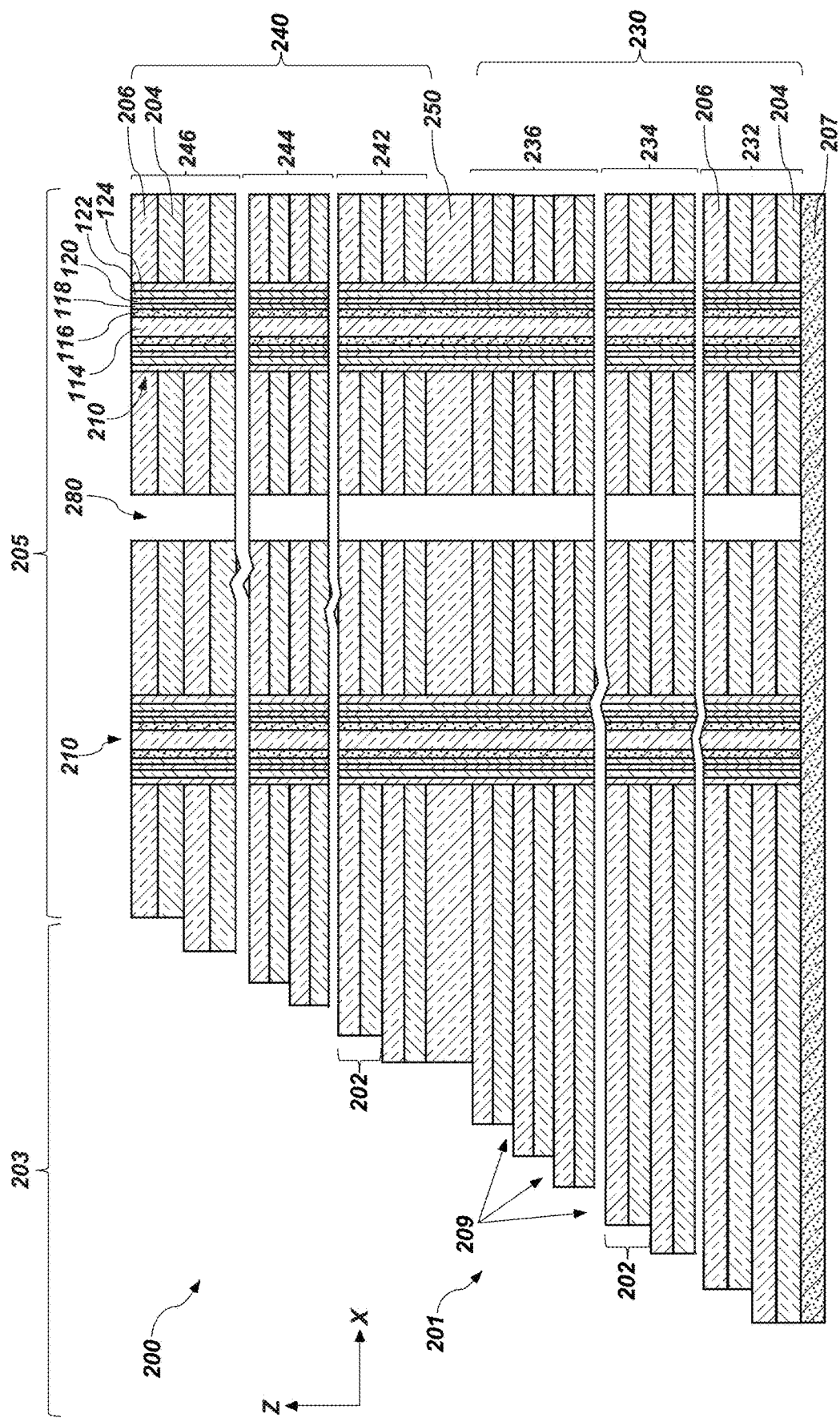
Figure 2C:
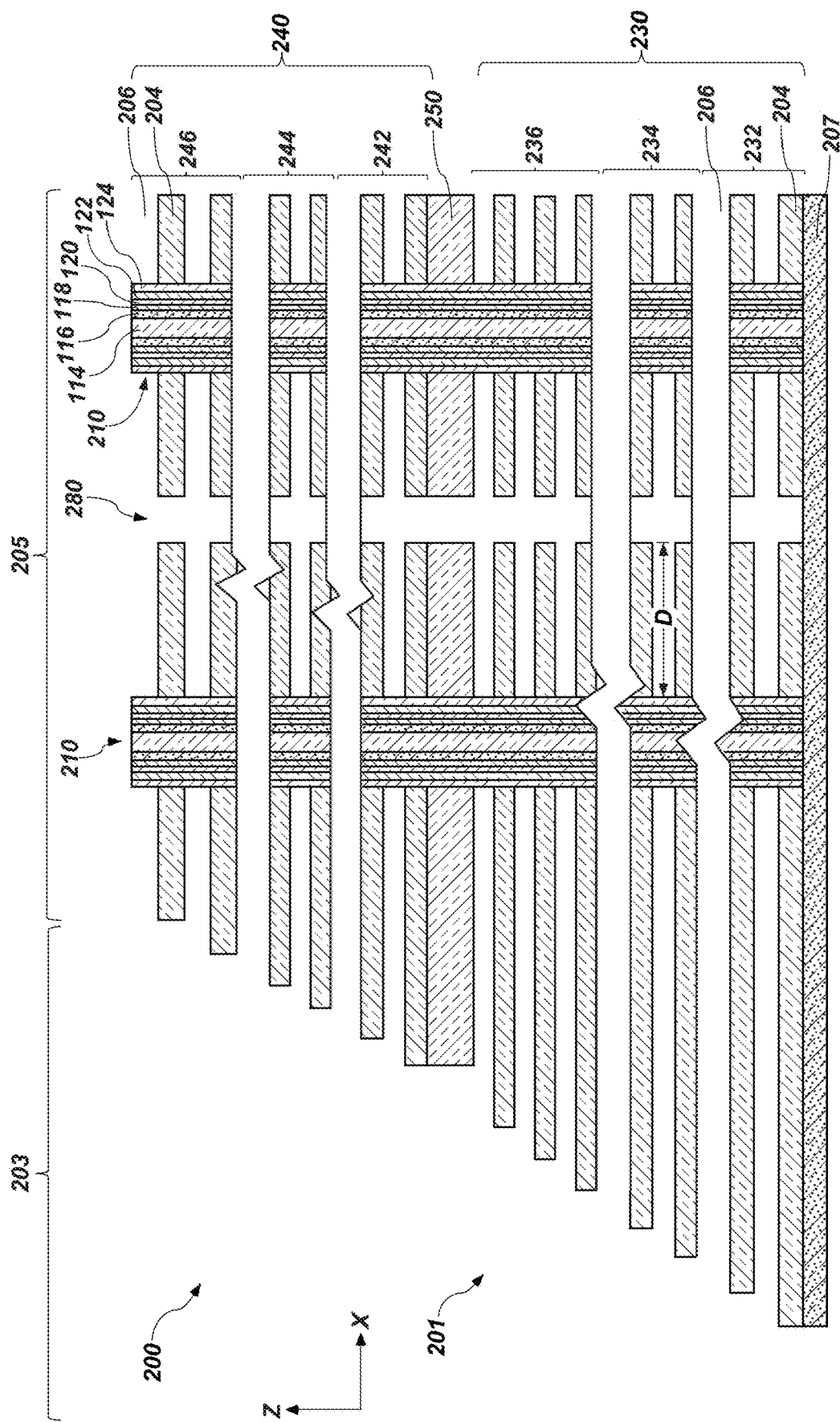

FIG. 2A through FIG. 2C are simplified cross-sectional views of a microelectronic device structure 200 illustrating a method of forming the microelectronic device 100 of FIG. 1A, in accordance with embodiments of the disclosure. With reference to FIG. 2A, the microelectronic device structure 200 may include a stack structure 201 including tiers 202 of an insulative material 204 and an other material 206. The insulative material 204 may include one or more of the materials described above with reference to the insulative material 104.

The other material 206 may be formed of and include a material exhibiting an etch selectivity with respect to the insulative material 204. In some embodiments, the other material 206 comprises a nitride material (e.g., silicon nitride ($Si_3N_4$)) or an oxynitride material (e.g., silicon oxynitride). In some embodiments, the other material 206 comprises silicon nitride. In other embodiments, the other material 206 comprises a conductive material, such as, for example, polysilicon or tungsten.

The tiers 202 of the insulative material 204 and the other material 206 may be adjacent to (e.g., overlie) a source material 207, which may be substantially the same as the source material 107.

The microelectronic device structure 200 may include a first deck structure 230 adjacent to (e.g., over) the source material 207, an interdeck structure 250 adjacent to (e.g., over the first deck structure 230), and a second deck structure 240 adjacent to (e.g., over) the interdeck structure 250. The first deck structure 230 may include a first region 232, a second region 234 adjacent to (e.g., over) the first region 232, and a third region 236 adjacent to (e.g., over) the second region 234. A number of tiers 202 of the first deck structure 230 and the second deck structure 240 may be substantially the same as the number of tiers 102 of the first deck structure 130 and the second deck structure 140 described above. In addition, a number of tiers 202 of each of the first region 232, the second region 234, and the third region 236 may be substantially the same as the number of tiers 102 of the respective ones of the first region 132, the second region 134, and the third region 136.

The second deck structure 240 may include a fourth region 242 adjacent to (e.g., over) the interdeck structure 250, a fifth region 244 adjacent to (e.g., over) the fourth region 242, and a sixth region 246 adjacent to (e.g., over) the fifth region 244. A number of tiers 202 of each of the fourth region 242, the fifth region 244, and the sixth region 246 may be substantially the same as the number of tiers 102 of the respective ones of the fourth region 142, the fifth region 144, and the sixth region 146.

The tier pitch of each of the respective first region 232, second region 234, third region 236, fourth region 242, fifth region 244, and sixth region 246 may exhibit varying tier pitches and may correspond substantially to the tier pitches of the respective ones of the first region 132, the second region 134, the third region 136, the fourth region 142, the fifth region 144, and the sixth region 146 described above.

In some embodiments, a thickness $T_9$ of the insulative materials 204 of the first region 232 may be about the same as the thickness $T_1$ of the insulative materials 104, except that the thickness $T_9$ may be about 2 nm greater than the thicknesses $T_1$ described above with reference to the thickness $T_1$. Similarly, a thickness $T_{11}$, $T_{13}$, $T_{11}$, $T_{13}$, $T_{15}$ of the insulative materials 204 of the other regions 234, 236, 242, 244, 246 may be about the same as the thicknesses $T_3$, $T_5$, $T_3$, $T_5$, $T_7$ of the insulative materials 104 described above, except that the thicknesses $T_{11}$, $T_{13}$, $T_{11}$, $T_{13}$, $T_{15}$ may be about 2 nm greater than the respective thicknesses $T_3$, $T_5$, $T_3$, $T_5$, $T_7$ described above.

In addition, a thickness $T_{10}$ of the other materials 206 may be about the same as the thickness $T_2$ of the conductive materials 106 described above, except that the thickness $T_{10}$ may be about 2 nm less than the thickness $T_2$ described above. Similarly, a thickness $T_{12}$, $T_{14}$, $T_{12}$, $T_{14}$, $T_{16}$ of the other materials 206 of the other regions 234, 236, 242, 244, 246 may be about the same as the thicknesses $T_4$, $T_6$, $T_4$, $T_6$, $T_8$ of the insulative materials 104 described above, except that the thicknesses $T_{12}$, $T_{14}$, $T_{12}$, $T_{14}$, $T_{16}$ may be about 2 nm greater than the respective thicknesses $T_4$, $T_6$, $T_4$, $T_6$, $T_8$ described above.

Accordingly, each of the insulative materials 204 and the other materials 206 may be formed (e.g., deposited) such that the tiers 202 of the different regions exhibit a different tier pitch. Referring to FIG. 2B, after forming the stack structure 201, a staircase structure may be formed to form a stair step region 203 including steps 209 comprising edges of the tiers 202 of the insulative materials 204 and the other materials 206. The staircase may be formed by, for example, forming a mask over the microelectronic device structure 200, removing a portion of the mask to expose an uppermost tier 202 of the insulative material 204 and the other material 206, removing a portion of the uppermost tier 202 of the insulative material 204 and the other material 206, trimming a portion of the mask to expose another portion of the uppermost tier 202, removing additional portions of the uppermost tier 202 and portions of the insulative materials 204 and the other materials 206 exposed by removal of the portion of the mask. The process of trimming the mask and removing portions of the insulative materials 204 and the other materials 206 may be repeated a desired number of times (e.g., corresponding to the number of tiers 202) to form the staircase structure.

After forming the staircase structure, pillar structures comprising a semiconductor material may be formed that, in combination with eventual conductive structures of the tiers 202 effectuate formation of vertically extending strings 210 of memory cells to form a memory cell region 205. As will be described herein, the strings 210 may be formed into strings 210 of memory cells (e.g., the strings 110 (FIG. 1A) of memory cells 112 (FIG. 1A)). For example, openings may be formed in the stack structure 201 and filled with, for example, the dielectric barrier material 124, the dielectric blocking material 122, the memory material 120, the tunnel dielectric material 118, the channel material 116, and the insulative material 114. Of course, other types of memory cells including different materials and different structures (e.g., the memory cells 112', 112") may be formed.

After forming the strings 210 of memory cells vertically extending through the stack structure 201, openings 280 may be formed through the stack structure 201 between some of the strings 210. With reference to FIG. 2C, the other materials 206 may be removed through the openings 280. For example, the other materials 206 may be exposed to a wet etchant comprising phosphoric acid to selectively remove the other materials 206 through the openings 280. The wet etchant may include materials other than, or in addition to, phosphoric acid, for selectively removing the other materials 206 with respect to the insulative materials 204.

With continued reference to FIG. 2C, the remaining insulative materials 204 may exhibit a cantilever shape exhibiting a relatively large aspect ratio (e.g., a ratio of the distance D from the string 210 to the opening 280 to the thickness of the insulative materials 204). The distance D may be within a range from about, for example, 300 nm to about 350 nm, such as from about 300 nm to about 325 nm or from about 325 nm to about 350 nm. Of course, the disclosure is not so limited and the distance D may be different than those described. In some embodiments, the distance D is larger at lower portions of the openings 280, such as in the first region 232 relative to other portions. By way of non-limiting example, in some embodiments, the distance D is greater in the first region 232 than in the second region 234, greater in the second region 234 than in the third region 236, greater in the third region 236 than in the fourth region 242, etc. In some embodiments, the distance D in the third region 236 may be about 240 nm while the distance D in the first region 232 may be about 290.

Due to the large distance D relative to the thickness of the insulative materials 204, the insulative materials 204 of conventional microelectronic device structures may be prone to failure and collapse. In addition, due to the larger distance D at the lower portions (e.g., in the first region 232) relative to other portions, the lowermost insulative materials 204 may be more prone to collapsing. However, since the insulative materials 204 are formed to have a varying thickness, such that the lowermost insulative materials 204 have a greater thickness than other insulative materials 204, the lowermost insulative materials 204 may be less prone to collapse compared to the insulative materials of conventional microelectronic devices.

After removing the other materials 206, electrically conductive materials (e.g., the conductive liner material 108 and the conductive materials 106) may be formed adjacent to the insulative materials 204 in the spaces left after removal of the other materials 206. After forming the conductive liner materials 108 and the conductive materials 106, the openings 280 may be filled with an insulative material to form the microelectronic device 100 of FIG. 1A.

Although FIG. 2A through FIG. 2C have been described and illustrated as forming the microelectronic device structure 200 by the replacement gate process (replacing the other materials 206) with conductive materials (e.g., the conductive materials 106 and the conductive liner material 108), the disclosure is not so limited. In other embodiments, the conductive materials 106 are not formed through a replacement gate process. For example, the other materials 206 may comprise an electrically conductive material that does not need to be replaced using a replacement gate process, such as, for example, polysilicon. With reference to FIG. 2A and FIG. 2B, in some such embodiments, the staircase structure may be formed to form the steps 209 and the strings 210 may be formed through the stack structure 201. The openings 280 may not be formed through the stack structure 201. Accordingly, a microelectronic device similar to the microelectronic device 100 of FIG. 1A may be formed, except that the microelectronic device may not include the insulative material 190 and may not include the conductive liner materials 108.

Accordingly, in some embodiments, a method of forming a microelectronic device comprises forming a stack structure comprising vertically alternating insulative structures and other structures arranged in tiers. Forming the stack structure comprises forming a first region comprising a first number of tiers of the insulative structures and the other structures having a first tier pitch, forming, adjacent to the first region, a second region comprising a second number of tiers of the insulative structures and the other structures having a second tier pitch less than the first tier pitch, and forming, adjacent to the second region, a third region comprising a third number of tiers of the insulative structures and the other structures having a third tier pitch less than the second tier pitch. The method further comprises forming strings of memory cells extending through the stack structure, memory cells of the second region spaced farther apart from each other than memory cells of the third region.

Figure 3:
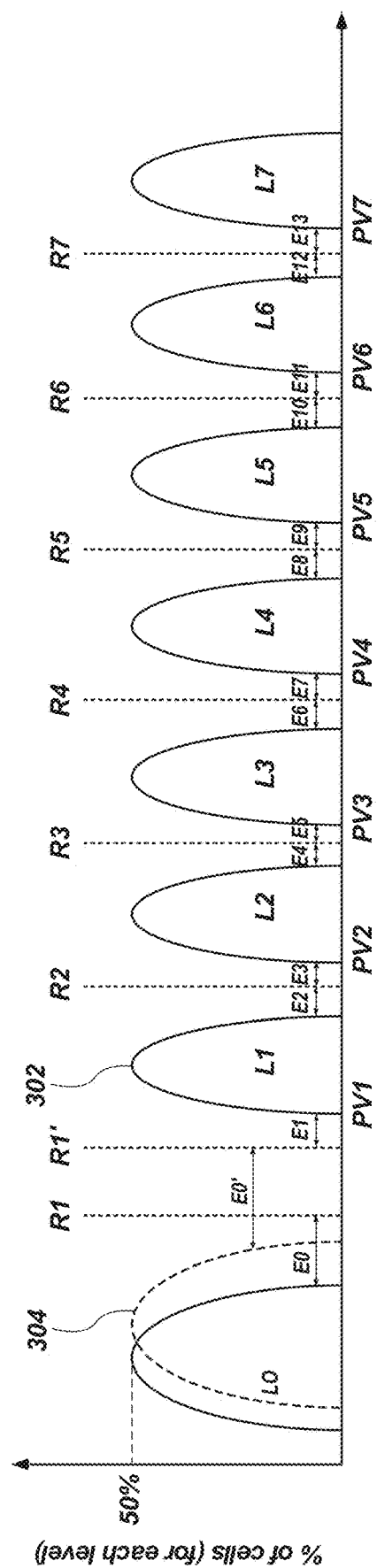
FIG. 3 is a graph illustrating electrical properties and operating characteristics of triple level memory cells, in accordance with embodiments of the disclosure.

FIG. 3 is a graph illustrating electrical properties and operating characteristics of memory cells comprising triple level cells formed according to the methods described herein. The memory cells may be similar to the memory cells 112 of the strings 110 described above with reference to FIG. 1A through FIG. 1D. In FIG. 3, the x-axis represents the voltage required to turn the memory cell on (e.g., a threshold voltage ($V_t$)) and the y-axis represents the percentage of cells for each level of a number of levels L0, L1, L2, L3, L4, L5, L6, L7 of the triple level cells. The levels may correspond to a state or condition of the triple level cells and may be distinguished from each other by their threshold voltage. Each level may exhibit a unique program verify (PV) threshold voltage level, PV1, PV2, PV3, PV4, PV5, PV6, and PV7. Programming of the memory cells may be performed by applying a sequence of programming pulses to the memory cells. In some embodiments, after each program pulse, a program verify pulse may be performed to determine if the threshold voltage of the particular level of the memory cell is larger than the particular PV level of the memory cell. If the threshold voltage is greater than the PV level, the memory cell may not be further programmed (e.g., inhibited). If the threshold voltage is less than the PV level, the memory cell may continue to receive program pulses with higher programming voltages until the threshold voltage is greater than the PV level.

In addition, each of the levels may exhibit a unique read threshold voltage, R1, R2, R3, R4, R5, R6, R7. The read threshold voltage for a particular level may be less than the program verify threshold voltage for that particular level to facilitate sufficient margin to distinguish between different levels of the memory cell. In other words, each level may have a margin between the read level threshold voltage and the $V_t$ distribution for the level. For example, level L0 may include a margin E0 between the $V_t$ distribution of L0 and R1. Level L1 may include a margin E1 between R1' and PV1 and margin E2 between an upper end of the $V_t$ distribution and R2. A read window budget (RWB) may determine the operating window of the memory cells and may comprise the sum of the margins E0-E13. Forming the memory cells (e.g., the memory cells 112 of the second region 134 and the fourth region 142) to include a greater tier pitch according to embodiments described herein may facilitate forming memory cells exhibiting a narrower $V_t$ distribution 302 for each level. The narrower $V_t$ distribution for each level may facilitate operation of the memory cells a narrower operating range (e.g., range between R1 and PV7) of the memory cell, while maintaining the same RWB as conventional memory cells.

For example, with continued reference to FIG. 3, curve 304 represents the threshold voltage distribution of level L0 after read disturb, which may consist of a few thousand to a few hundreds of thousands of read operations of NAND cells. As illustrated in FIG. 3, the distance between L0 and R1 decreases due to the read disturb. However, since the margins E1-E13 are larger and the memory cells exhibit a narrower $V_t$ distribution due to the structure of the memory cells formed according to embodiments described herein, the L0 memory cells may include a greater margin by increasing the value of R1 to R1' without increasing the value of PV7. In other words, since the RWB margin for TLC levels between R1 and PV7 is increased from narrower $V_t$ of distribution of L1-L6, the value of R1 may be increased to R1' to compensate for the effects of read disturb and improve the operation of the memory cell while maintaining a sufficient margin E1-E13. Stated another way, by increasing the value of R1 to R1' for tiers 102 of the second region 134 and the fourth region 142, the margin E0' may be increased to compensate for the effects of read disturb.

Figure 4:
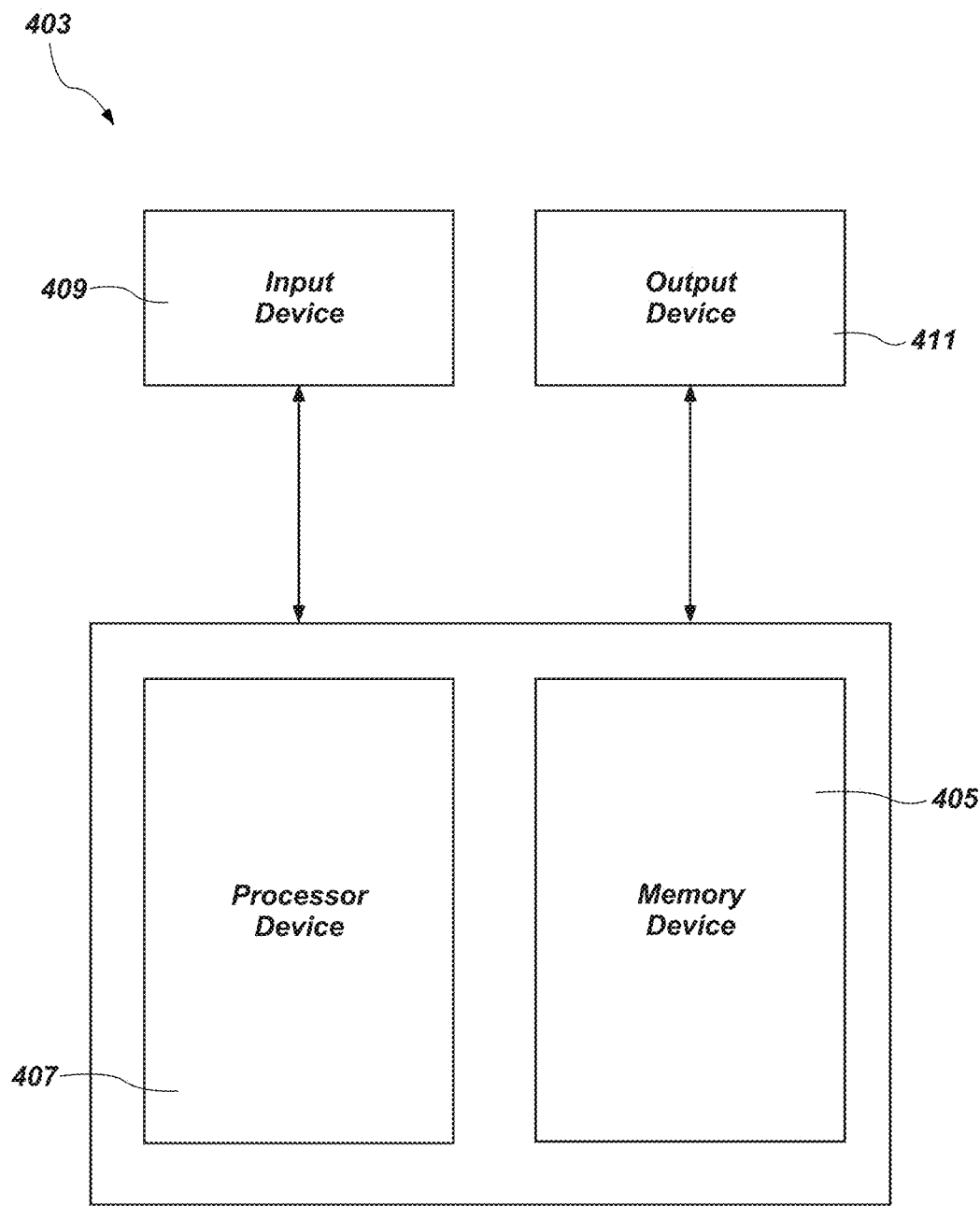
FIG. 4 is a block diagram of an electronic system, in accordance with embodiments of the disclosure.

Microelectronic devices including microelectronic devices (e.g., the microelectronic device 100) and microelectronic device structures (e.g., the microelectronic device structures 200) including the varying tier pitch in accordance with embodiments of the disclosure may be used in embodiments of electronic systems of the disclosure. For example, FIG. 4 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., one of the microelectronic device 100 or the microelectronic device structure 200) previously described (with reference to FIG. 1A, FIG. 2A through FIG. 2C) including the varying tier pitch.

The electronic system 403 may further include at least one electronic signal processor device 407 (often referred to as a "microprocessor"). The electronic signal processor device 407 may, optionally, include an embodiment of a microelectronic device or a microelectronic device structure previously described herein (e.g., one or more of the microelectronic device 100 or the microelectronic device structure 200 previously described with reference to FIG. 1A and FIG. 2A through FIG. 2C). The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 5:
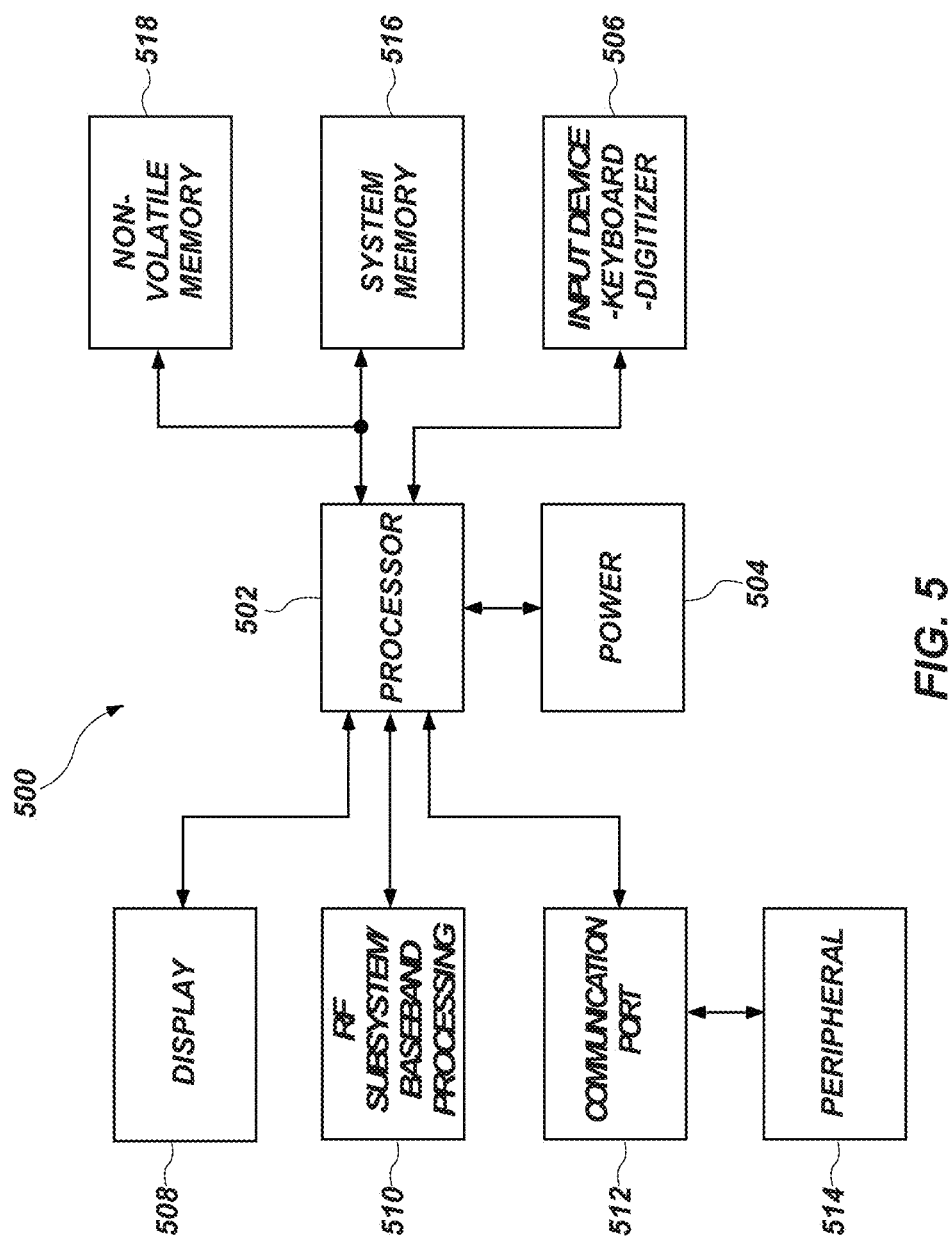
FIG. 5 is a processor-based system, in accordance with embodiments of the disclosure.

With reference to FIG. 5, depicted is a processor-based system 500. The processor-based system 500 may include various microelectronic devices and microelectronic device structures (e.g., microelectronic devices and microelectronic device structures including one or more of the microelectronic device 100 or the microelectronic device structure 200) manufactured in accordance with embodiments of the present disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include microelectronic devices and microelectronic device structures (e.g., microelectronic devices and microelectronic device structures including one or more of the microelectronic device 100 or the microelectronic device structure 200) manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as the microelectronic devices and microelectronic device structures (e.g., the microelectronic device 100 and the microelectronic device structure 200) described above, or a combination thereof.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as the microelectronic devices and microelectronic device structures (e.g., the microelectronic device 100 and the microelectronic device structure 200) described above, or a combination thereof.

Accordingly, in at least some embodiments, an electronic device comprises an input device, an output device, a processor device operably coupled to the input device and the output device, and a memory device operably coupled to the processor device and comprising at least one microelectronic device. The at least one microelectronic device comprises a stack structure comprising a deck structure comprising alternating levels of an insulative material and a conductive material, a thickness of the insulative materials within a lower portion of the deck structure greater than a thickness of the insulative materials within an upper portion of the deck structure, and strings of memory cells extending through a stack structure, memory cells in the upper portion of the deck structure spaced apart from one another than memory cells in the lower portion of the deck structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A memory device, comprising:
   a deck structure comprising:
   a first region including first tiers individually having a first vertical thickness and respectively comprising:
   a first insulative structure; and
   a first conductive structure vertically adjacent the first insulative structure;
   a second region overlying the first region and including second tiers individually having a second vertical thickness less than the first vertical thickness, the second tiers respectively comprising:
   a second insulative structure; and
   a second conductive structure vertically adjacent the second insulative structure; and
   pillar structures vertically extending through the first region and the second region of the deck structure, the pillar structures respectively comprising semiconductive material.

2. The memory device of claim 1, wherein a quantity of the first tiers within the first region is within a range of from 1 of the first tiers to 20 of the first tiers.

3. The memory device of claim 1, wherein a vertical height of the first insulative structure of each of the first tiers is within a range of from about 1 percent to about 10 percent greater than another vertical height of the second insulative structure of each of the second tiers.

4. The memory device of claim 1, wherein a vertical height of the first conductive structure of each of the first tiers is within a range of from about 1 percent to about 10 percent greater than another vertical height of the second conductive structure of each of the second tiers.

5. The memory device of claim 1, wherein:
   the first insulative structure of each of the first tiers has a first vertical dimension within a range of from about 20 nm to about 30 nm; and
   the first conductive structure of each of the first tiers has a first additional vertical dimension within a range of from about 25 nm to about 35 nm.

6. The memory device of claim 5, wherein:
   the second insulative structure of each of the second tiers of the second region has a second vertical dimension within a range of from about 20 nm to about 30 nm; and
   the second conductive structure of each of the second tiers of the second region has a second additional vertical dimension within a range of from about 24 nm to about 34 nm.

7. The memory device of claim 1, wherein a quantity of the second tiers within the second region is within a range of from 10 of the second tiers to 30 of the second tiers.

8. The memory device of claim 1, wherein:
the deck structure further comprises a third region vertically overlying the second region and including third tiers individually having a third vertical thickness less than the second vertical thickness, the third tiers respectively comprising:
a third insulative structure; and
a third conductive structure vertically adjacent the third insulative structure; and
the pillar structures also vertically extend through the third region of the deck structure.

9. The memory device of claim 8, wherein a vertical height of the first insulative structure of each of the first tiers is within a range of from about 1 percent to about 20 percent greater than another vertical height of the third insulative structure of each of the third tiers.

10. The memory device of claim 8, wherein a vertical height of the first conductive structure of each of the first tiers is within a range of from about 1 percent to about 20 percent greater than another vertical height of the third conductive structure of each of the third tiers.

11. The memory device of claim 8, wherein:
the third insulative structure of each of the third tiers of the third region has a third vertical dimension within a range of from about 16 nm to about 24 nm; and
the third conductive structure of each of the third tiers of the third region has a third additional vertical dimension within a range of from about 24 nm to about 34 nm.

12. The memory device of claim 8, further comprising:
an insulative, interdeck structure overlying the third region of the deck structure; and
an additional deck structure vertically overlying the insulative, interdeck structure and including additional tiers respectively comprising a first insulative structure and a first conductive structure vertically adjacent the first insulative structure.

13. A NAND Flash memory device, comprising:
a stack structure comprising:
a first region including first tiers having a first tier pitch, at least some of the first tiers respectively comprising a conductive select gate structure and insulative material vertically adjacent the conductive select gate structure;
a second region overlying the first region and including second tiers having a second tier pitch less than the first tier pitch, at least some of the second tiers respectively comprising a conductive word line structure and the insulative material vertically adjacent the conductive word line structure; and
a third region overlying the second region and including third tiers having a third tier pitch less than the second tier pitch, at least some of the third tiers respectively comprising an additional conductive word line structure and the insulative material vertically adjacent the additional conductive word line structure; and
strings of memory cells vertically extending through the stack structure.

14. The NAND Flash memory device of claim 13, wherein memory cells of respective ones of the strings of memory cells comprise:
first memory cells within the first region of the stack structure, the first memory cells vertically spaced apart from one another by a first distance;
second memory cells within the second region of the stack structure, the second memory cells vertically spaced apart from one another by a second distance less than the first distance; and
third memory cells within the third region of the stack structure, the third memory cells vertically spaced apart from one another by a third distance less than the second distance.

15. The NAND Flash memory device of claim 14, wherein:
the first memory cells within the first region of the stack structure comprise single level memory cells;
the second memory cells within the second region of the stack structure comprise triple level memory cells; and
the third memory cells within the third region of the stack structure comprise additional triple level memory cells.

16. The NAND Flash memory device of claim 15, wherein an operating voltage range of the second memory cells is narrower than an additional operating voltage range of the third memory cells.

17. The NAND Flash memory device of claim 14, wherein the second memory cells within the second region of the stack structure have a larger read write budget (RWB) as compared to the third memory cells within the second region of the stack structure.

18. The NAND Flash memory device of claim 13, wherein the second tier pitch of the second tiers is about 2 nm less than the first tier pitch of the first tiers and about 2 nm greater than the third tier pitch of the third tiers.

19. An electronic system, comprising:
an input device;
an output device;
a processor device operably coupled to the input device and the output device; and
a non-volatile memory device operably coupled to the processor device and comprising:
a deck structure comprising:
a first region including first tiers individually having a first vertical thickness, the first tiers respectively comprising conductive material and insulative material vertically adjacent the conductive material;
a second region overlying the first region and including second tiers individually having a second vertical thickness less than the first vertical thickness, the second tiers respectively comprising the conductive material and the insulative material vertically adjacent the conductive material; and
a third region overlying the second region and including third tiers individually having a third vertical thickness less than the second vertical thickness, the third tiers respectively comprising the conductive material and the insulative material vertically adjacent the conductive material; and
strings of memory cells vertically extending through the deck structure and comprising:
single level memory cells within the first region of the deck structure;
triple level memory cells within the second region of the deck structure; and
additional triple level memory cells within the third region of the deck structure.

* * * * *

UNITED STATES PATENT AND TRADEMARK OFFICE
CERTIFICATE OF CORRECTION

PATENT NO. : 12,160,993 B2  
APPLICATION NO. : 18/460462  
DATED : December 3, 2024  
INVENTOR(S) : Yifen Liu et al.

Page 1 of 1

It is certified that error appears in the above-identified patent and that said Letters Patent is hereby corrected as shown below:

In the Specification

Column 7, Lines 30-31, change "borophosphosilicate glass (BPS G), silicon" to --borophosphosilicate glass (BPSG), silicon--

Signed and Sealed this
Twenty-fifth Day of February, 2025

Coke Morgan Stewart
*Acting Director of the United States Patent and Trademark Office*